United States Patent [19]

Borras et al.

[11] Patent Number: 4,631,496

[45] Date of Patent: Dec. 23, 1986

[54] BATTERY SAVING SYSTEM FOR A FREQUENCY SYNTHESIZER

[75] Inventors: Jaime A. Borras, Hialeah; Jose I. Suarez, Miami, both of Fla.

[73] Assignee: Motorola, Inc., Schaumburg, Ill.

[21] Appl. No.: 808,905

[22] Filed: Dec. 13, 1985

Related U.S. Application Data

[63] Continuation-in-part of Ser. No. 650,977, Sep. 14, 1984, abandoned, which is a continuation of Ser. No. 251,558, Apr. 6, 1981, abandoned.

[51] Int. Cl.[4] .......................... H03L 7/18; H04B 1/40
[52] U.S. Cl. ..................................... 331/1 A; 331/14; 331/25; 331/186; 455/76; 455/343
[58] Field of Search ................... 331/1 A, 14, 25, 185, 331/186; 455/76, 86, 87, 127, 260, 343

[56] References Cited

U.S. PATENT DOCUMENTS

| | | | |
|---|---|---|---|
| 2,884,518 | 4/1959 | O'Neill | 455/343 X |
| 3,488,596 | 1/1970 | Webster et al. | 455/343 X |
| 3,611,156 | 10/1971 | Ward | 455/343 X |
| 4,179,670 | 12/1979 | Kingsbury | 331/25 X |
| 4,194,153 | 3/1980 | Masaki et al. | 455/343 X |
| 4,521,918 | 6/1985 | Challen | 331/14 X |

FOREIGN PATENT DOCUMENTS 1591621 2/1971 Fed. Rep. of Germany ...... 455/343
2426649 12/1975 Fed. Rep. of Germany ...... 455/343

Primary Examiner—Siegfried H. Grimm
Attorney, Agent, or Firm—Joseph T. Downey; Edward M. Roney; Donald B. Southard

[57] ABSTRACT

A frequency synthesized transceiver capable of tuning to a plurality of communication channels is disclosed. The transceiver includes a receiver and a transmitter section which are coupled to the synthesizer which generates the appropriate injection signals to achieve tuning. A battery saving circuit generates a battery saving signal having a predetermined duty cycle and period and is responsive to the phase detector in the synthesizer to disrupt power to the synthesizer while maintaining precise tuning. The battery saver circuit is also responsive to the transceiver. In a normal receive operation, a battery saving circuit synchronizes its battery saving signal with the hold condition of the phase detector to disrupt power to selected modules in the synthesizer without altering the injection frequency of the receiver. In a standby mode, power is disrupted to all modules in the receiver, the selected modules in the phase locked loop and the voltage controlled oscillator. During a transmit mode all battery saving is terminated.

15 Claims, 8 Drawing Figures

BATTERY SAVING SYSTEM FOR A FREQUENCY SYNTHESIZER

CROSS REFERENCE TO RELATED APPLICATIONS

This application is a continuation-in-part application of U.S. Ser. No. 650,977 filed 09/14/84 in the names of Borras, et al. for "Battery Saving System for a Frequency Synthesizer" which is now abandoned and is itself a continuation application of U.S. Ser. No. 251,558 filed 04/06/81 in the names of Borras, et al., bearing the same title, and now abandoned.

This application is also related to U.S. Ser. No. 251,565 filed 04/06/81 in the names of Borras, et al. for "Priority Channel System for a Synthesized Transceiver" which is now issued as U.S. Pat. No. 4,394,776 and is hereby incorporated by reference. All of the referenced applications were assigned to a common assignee.

BACKGROUND OF THE INVENTION

1. Field of the Invention

This invention relates generally to the field of frequency synthesizer systems and more particularly to such systems for use in communication transceivers. It further relates to a battery saving system for synthesized transceivers.

2. Description of the Prior Art

It is recognized that for many years there has been an ever increasing demand for FM two-way portable radios. This stems from the increasing use of portable radio communications in business, industry and government. The level of sophistication of the communication networks utilized by various institutions has constantly risen, and with that increase has come the demand for the capability of the portable transceivers to operate over a much larger number of frequencies. The majority of two-way FM portable radios currently in use are those which employ conventional crystal controlled frequency channel elements. Thus, as each portable radio is required to either transmit or receive on more than one frequency, an additional crystal controlled channel element must be included and electrically actuated so that both transmission and/or reception can occur.

As is the case with the several networks or systems, many different frequency combinations are grouped into communication channels from the available frequencies within a given area. Thus, any portable transceiver customer must specify to the manufacturer the desired pairs of receive and transmit frequencies for the several communication channels which are required in portable transceivers for a selected area. With such an order, the corresponding crystals to enable two-way communication on those channels must be manufactured and inserted into the transceiver. Frequently, design modifications must be made to accommodate the additional channel elements resulting in an increased size and weight of unit and a greatly increased cost.

The required long lead time for the manufacture of multifrequency transceivers to meet the market demand has caused a general trend toward the use of frequency synthesis in the design of FM two-way portable radios. The combination of a master oscillator signal with a secondary signal in a suitable mixer can provide the choice of a number of controlled frequencies. If a stable variable frequency oscillator is substituted for a fixed crystal oscillator and a digital frequency synthesis technique is employed, a virtually unlimited number of discrete frequencies directly related to the frequency of the master oscillator are available. Instead of providing a plurality of individual channel elements suitable for each individual user's purpose, a manufacturer can provide one or more crystal controlled oscillators and a programmable memory which can be modified at the factory to conform to an individual user's required frequencies. This enables a manufacturer to assemble virtually all of his transceiver units in the same way and near the last step in the manufacturing process insert the memory programmed to the individual user's frequency requirements.

One of the basic problems with the use of frequency synthesized portable radios is the limited power available for the portable hand-held units. Thus, any frequency synthesis system must not be wasteful of the limited battery capacity available in the portable units. Portable radios are frequently designed to operate efficiently for an eight-hour duration on some predetermined duty cycle designating the percentage of time it would be used to receive, transmit and to remain on standby. As, for example, a 5-5-90 would represent 5% receive, 5% transmit and 90% standby, and this forms a standard by which the power consumption of various radios may be compared. What may also be seen is that such a radio spends the vast majority of its time in a standby mode.

One prior art receiver has a switch connected between the battery and the frequency synthesizer whose output is coupled directly to the voltage controlled oscillator and to a capacitor operating as a voltage memory. When the battery switch is periodically opened, the power to the frequency regulation is disrupted, its output is disconnected from the VCO and the voltage memory capacitor is used to supply voltage to the VCO and hence maintain the tuning. The latest state of the art technology utilizes CMOS for the dividers thus reducing their overall current drain. It also fails to recognize that the highest current drawing component in a synthesized transceiver which is designed to match the performance characteristics of crystal controlled transceivers is the VCO. Therefore, the switched regulating circuit of the prior art can best only provide a small enhancement of battery life for a synthesized transceiver. It also makes no provision to guarantee that the synthesizer will not go out of a lock condition when the battery saving operation is imposed.

In addition, it has been found that various design implementations of digital frequency synthesizers do not meet the rigid specifications which are applied to radios which employ crystal controlled channel elements. It is well recognized in the art that crystal controlled channel elements produce extremely well defined frequencies. Present designs of digital frequency synthesizers can provide the same degree of accurate tuning in portable transceivers as can the crystal controlled channel elements but at the cost of higher current drain primarily due to the VCO.

The problem is therefore to find a digital frequency synthesized transceiver system for portable transceivers programmability which will provide the size reduction, cost efficiency, and most importantly, the power conservation that a multitude of users require yet can stay within the rigid performance specifications that apply to the use of crystal controlled elements.

SUMMARY OF THE INVENTION

It is an object of the present invention to provide a battery saving system for a frequency synthesizer.

It is another object of the present invention to conserve the battery life in frequency synthesized portable equipment.

In a digital frequency synthesized portable transceiver having a reference frequency source, and a phase locked loop, a battery saving system comprises power supply means supplying power to the transceiver and synthesizer including power to the phase locked loop, a signal generator generating a battery saving signal having a predetermined duty cycle and a period; and logic means responsive to the signal generator and coupled to the power supply means for disrupting the supply of power to the critical phase locked loop components as well as the transceiver during a selected portion of said battery saving signal.

DESCRIPTION OF THE PREFERRED EMBODIMENT

Figure 1:
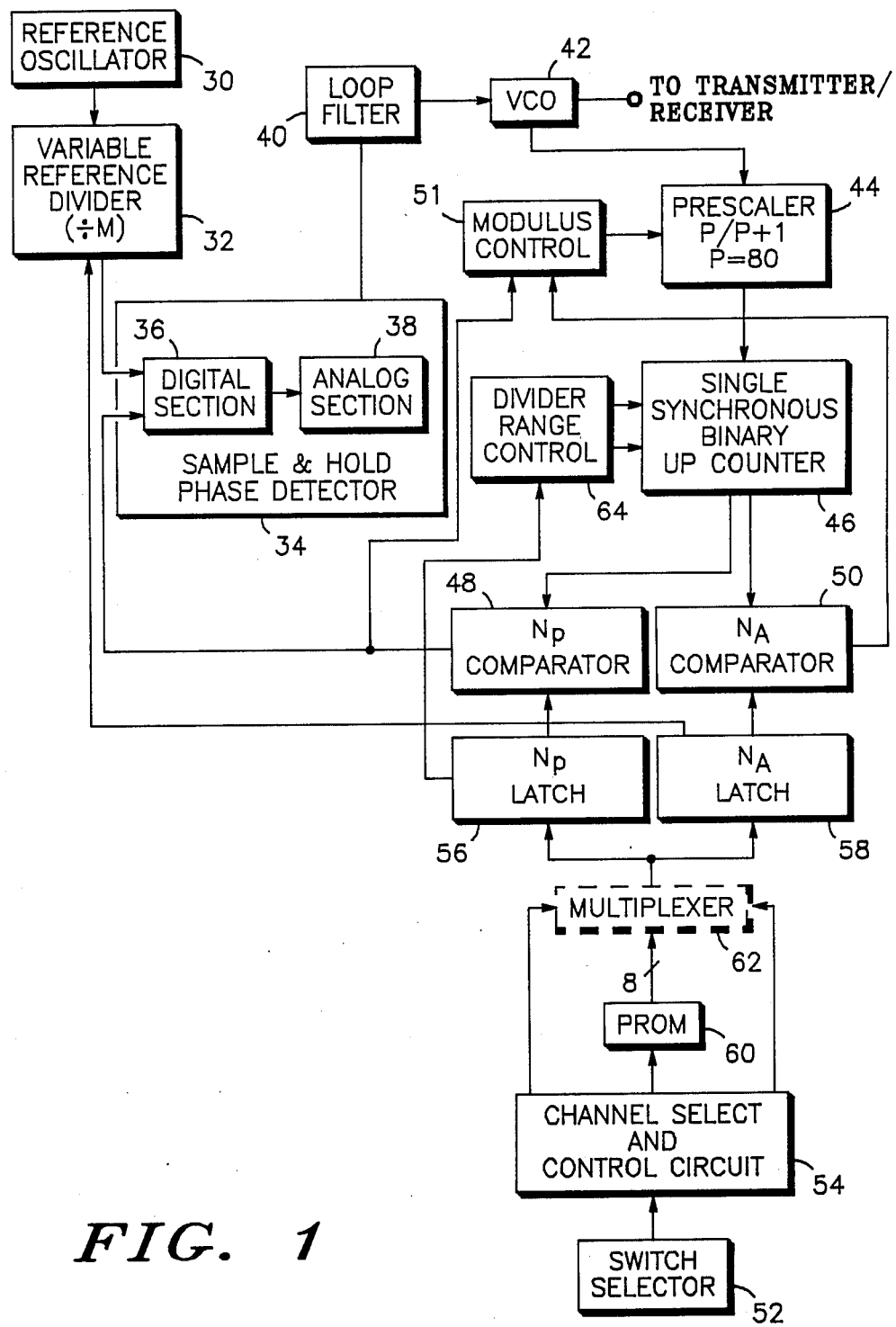
FIG. 1 is a functional block diagram of the digital frequency synthesizer system for the present invention.

FIG. 1 is a functional block diagram of the digital frequency synthesizer of the present invention. A reference oscillator 30 supplies an output signal to a variable reference divider 32 which is coupled to a sample and hold phase detector 34. Sample and hold phase detector 34 is shown to include a digital section 36 and an analog section 38. The output of phase detector 34 is supplied to a loop filter 40. Loop filter 40 is connected to a voltage controlled oscillator 42 which has a first output coupled to either a transmitter or a receiver and a second output coupled to a prescaler circuit 44. The output of prescaler circuit 44 is supplied to a synchronous binary up counter 46. Two signal outputs of counter 46 are applied to an $N_P$ comparator 48 and a $N_A$ comparator 50. An output of $N_P$ comparator 48 and an output of $N_A$ comparator 50 are coupled to a modulus control circuit 51. The output of modulus control circuit 51 is coupled to prescaler 44. The output of $N_P$ comparator 48 is also coupled to digital section 36 of phase detector 34.

A frequency switch selector 52 is coupled to a channel select and control circuit 54 which supplies signals to an $N_P$ latch circuit 56 and an $N_A$ latch circuit 58. An output of channel select and control circuit 54 is also supplied to a programmable read-only memory PROM 60. The output of PROM 60 is coupled to a multiplexer 62 shown in phantom which in response to enable signals from channel select and control circuit 54 alternatiely supplies information to $N_P$ latch 56 and $N_A$ latch 58. Multiplexer 62 is not a physical device but rather represents the operation of transferring information from PROM 60 the latches. $N_P$ latch 56 is coupled to a range divider control 64 which is coupled to synchronous binary counter 46. $N_P$ latch 56 is also coupled to $N_P$ comparator 48. An output from $N_A$ latch 58 is coupled to variable reference divider 32. $N_A$ latch 58 is also coupled to $N_A$ comparator 50.

In normal operation, switch selector 52 is actuated by the portable transceiver operator to select a desired communication channel and supplies information to channel select and control circuit 54 which in turn accesses PROM 60 to address a specific location which contains the $N_A$ and the $N_P$ numerical divisors in their binary number configurations. The binary number configurations of the two divisors are supplied through multiplexer 62 and loaded into the appropriate $N_P$ latch 56 and $N_A$ latch 58. The purpose of the latches is to allow the information for subsequent comparisons to be available so that comparisons can be made at any time during the sampling operation even though power to the programmable read-only memory is terminated to reduce battery drain.

Reference oscillator 30 supplies a stable fixed frequency signal to variable reference divider 32. A portion of the binary configuration of the $N_A$ numerical divisor as stored in $N_A$ latch 58 is supplied to variable reference divider 32 to establish the desired channel spacing for the portable transceiver. The sample and hold phase detector operates in both a digital and analog manner to provide a fast response and precise phase comparison for the loop operation. The output of phase detector 34 is supplied through a loop filter to the voltage controlled oscillator 42. The voltage controlled oscillator 42 is coupled in a normal manner alternatively to the transmitter or receiver to cause tuning of the transceiver and is also supplied to prescaler circuit 44. A portion of the binary configuration for numerical divisor $N_P$ as stored in $N_P$ latch 56 is utilized by divider range control circuit 64 and synchronous binary counter 46 to enable counting in the correct range for the desired tuning.

An output of $N_A$ comparator 50 is supplied to modulus control 51 and then to prescaler 44 to control the selection of the modulus for the prescaler operation. The prescaler begins its operation at one modulus and when the $N_A$ comparator indicates that a comparison has been reached, the modulus is then changed to another integer value. This change in cooperation with divider range control 64, allows the single synchronous binary counter 46 to correctly determine the frequency and supply appropriate signals to $N_A$ comparator 50 and $N_P$ comparator 48. While the operation of the $N_A$ comparator serves principally to change the prescaler modulus value at a crucial time, the operation of the $N_P$ comparator is fed back through the digital section 36 of the phase detector 34 and provides completion of the phase lock loop circuit. The combination of the $N_A$ and $N_P$ comparators along with the divider range control and the selectable prescaler allow the operation of a single synchronous counter to provide all of the division ratios necessary in the phase locked loop to achieve correct tuning.

The phase locked loop circuit compares a divided down reference frequency from stable reference oscillator 30 to a sub-multiple of the voltage controlled oscillator frequency and makes corrections to VCO 42 in order to force the frequencies to be equal. The variable reference divider ratio is derived from information contained in the binary equivalent of the $N_A$ numerical divisor as loaded in $N_A$ latch 58. The function of prescaler 44, synchronous counter 46, range divider control 64 and comparators 48 and 50 is to provide a "divide by a variable number" function which may be called $N_T$. For tuning, the M divider ratio is programmed to correspond to the appropriate reference frequency, and $N_T$ is varied in order to move the voltage controlled output frequency in increments equal to the reference frequency. The reference value may be determined by considering both the minimum channel spacing and the transceiver multiplier.

The tuning is achieved by programming the appropriate reference frequency through a chain of dividers which may be summed up as dividing by an integer M. Once the reference frequency is established, the phase detector circuit compares the reference frequency to a sub-multiple of the VCO frequency. Sample and hold phase detector 34 operates much like a standard phase detector when the reference and VCO submultiple signals are not at the same frequency. However, a distinguishing phase mode of operation is established when the reference and the VCO submultiple signals are at the same frequency and the reference signal is leading in phase. Digitally this corresponds to a condition in which the variable VCO pulse is interleaved in one period of the reference pulse. A voltage proportional to the phase difference between these signals is applied to loop filter 40 to steer VCO 42 and thus correct for any variations in the VCO frequency. For the dual modulus prescaler, the VCO output frequency is divided down by first P plus one and then P. For every P plus one pulse entering the programmable counter, both the $N_A$ count and the $N_P$ count are incremented by one. The dual modulus prescaler divides by P plus one until the count reaches the $N_A$ program state, then the modulus of prescaler 44 is changed to P. The prescaler divides by P a total of $N_P$-$N_A$ pulses until the $N_P$ program stage is achieved. Once the $N_P$ count is detected, the system resets and the cycle repeats by operating through modulus control 51.

Figure 2:
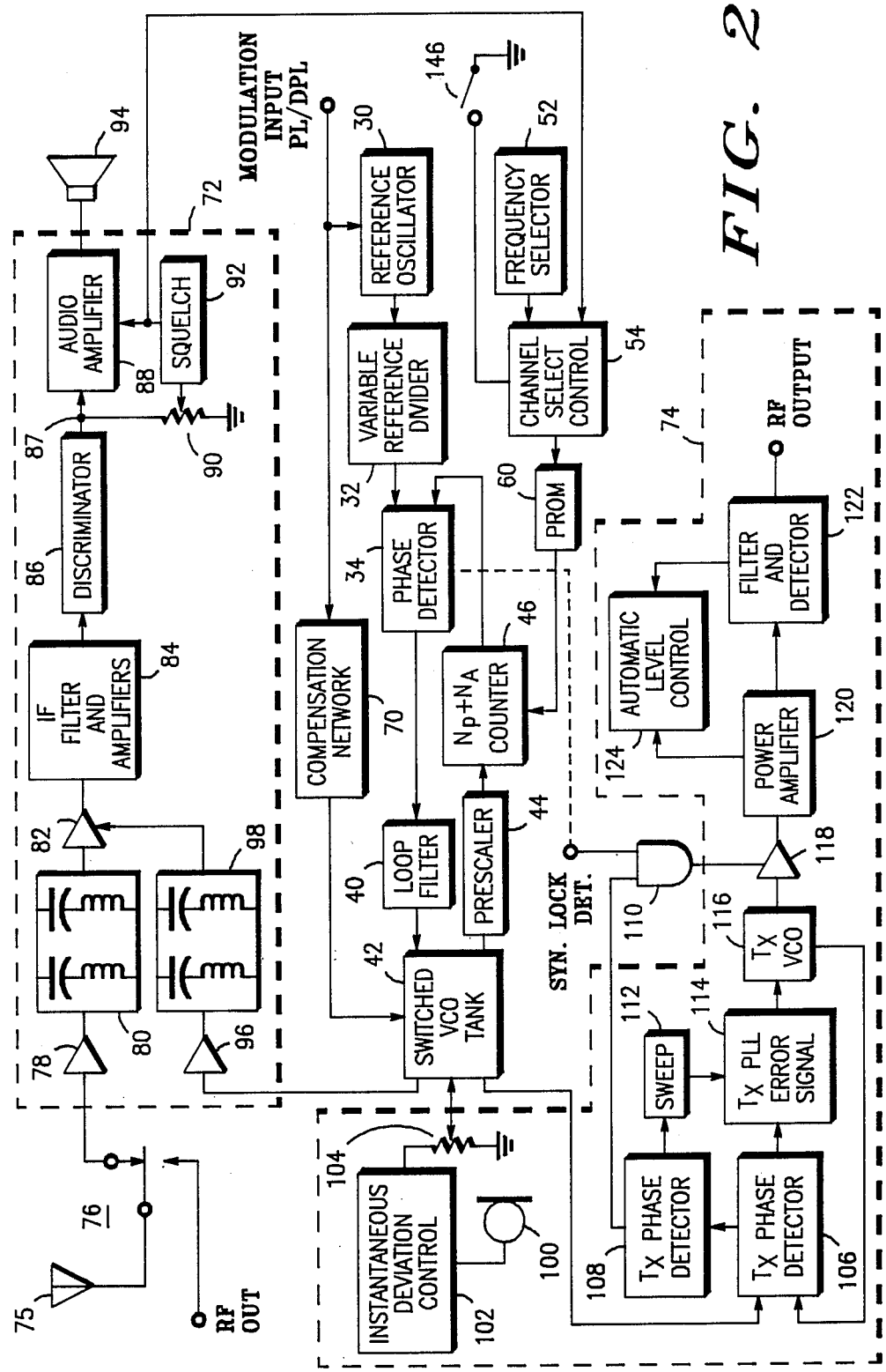
FIG. 2 is a functional block diagram of a VHF transceiver employing the present battery saver invention.

FIG. 2 is a functional block diagram of a complete VHF transceiver employing the digital frequency synthesizer employing the battery saver circuit. Consistent with the description in FIG. 1, frequency selector 52 is coupled to channel select control 54 which is coupled to PROM 60 which supplies programmed information to $N_P$ and $N_A$ counter 46. A switch 146 is coupled between ground and channel select control 54 which serves as a push to talk switch. The digital synthesizer employes reference oscillator 30 coupled through variable frequency divider 32 to phase detector 34 which also receives an input from counter 46. The output of phase detector 34 is coupled to loop filter 40 which is also coupled to VCO 42. VCO 42 is further described as a switched tank VCO. VCO 42 is connected through prescaler 44 to $N_P$ and $N_A$ counter 46. An input signal designated modulation input is applied to reference oscillator 30 and through comparison network 70 to VCO 42. This collection of functional blocks represents the frequency synthesizer system more completely described in FIG. 1.

To understand the operation of the transceiver it is necessary to distinguish the separate receiver and transmitter sections functions with respect to the digital frequency synthesizer. FIG. 2 is segregated into two distinct circuit sections, each of which is enclosed by a broken line. In particular, the receiver section is designated 72 while the transmitter section is designated 74.

An antenna 75 is coupled through antenna switch 76 to an RF amplifier 78 in receiver section 72. The output of amplifier 78 is coupled to a four pole filter 80 which is coupled to mixer 82. The output of mixer 82 is coupled to IF filter and amplifier 84 whose output is coupled to discriminator 86. The output of discriminator 86 is directly coupled to audio amplifier 88 and through potentiometer 90 to ground. A squelch control circuit 92 is connected to a variable tap of potentiometer 90 and its output is connected to audio amplifier 88 and battery saver generator/channel select control 54. The output of audio amplifier 88 is connected to a speaker 94. An output of VCO 42 from the frequency synthesizer section is coupled through a times two multiplier 96 and a three pole filter 98 to mixer 82.

For transmitter section 74, a microphone 100 is coupled through an instantaneous deviation control circuit 102 to a potentiometer 104. The variable tap of potentiometer 104 is coupled to switched tank VCO 42. The second output of VCO 42 is coupled to a transmitter phase detector 106 to provide a synthesized reference frequency source for the transmitter phase locked loop. The output of transmitter phase detector 106 is coupled to a transmitter lock detector 108 which has a first output coupled to PLL interface gate 110 and a second output coupled to sweep control 112. The output of sweep control 112 is coupled to error signal circuit 114, which also receives an input directly from phase detector 106. The output of error signal circuit 114 is coupled to a transmitter VCO 116 which has a first output coupled back to phase detector 106. A second output of transmitter VCO 116 is coupled to RF gate 118. A signal from synthesizer phase detector 34 is applied to a second input of PLL interface gate 110.

The output of gate 110 is applied to a control input of RF gate 118. The output of RF gate 118 is coupled to a power amplifier 120 whose output is coupled to a filter and detector 122. The output of filter and detector 122 is coupled back through an automatic level control 124 to a control input of power amplifier 120. A second output of filter and detector 122 is designated RF output which is connected to the second terminal of antenna switch 76.

In operation, for the receiver section, antenna 75 provides a signal to RF amplifier 78 which both amplifies and filters it and supplies the amplified and filtered signal through four pole filters 80 to mixer 82. The output of the digital synthesizer controlled VCO 42 is coupled through a times two multiplier 96 and through a three pole filter 98 to mixer 82. In a standard method, the two signals are combined in the mixer using a superheterodyning technique to produce an intermediate frequency signal which is supplied through IF filter and amplifier 84 to a discriminator 86 which detects carrier encoded information. The detected information is supplied through a junction 87 to audio amplifier 88. In a manner consistent with normal operation squelch control 92, which has an adjustable threshold level is coupled to the audio amplifier. The output of squelch circuit 92 is designated as the signal Y. At the output of the audio amplifier is a standard speaker through which the decoded information is converter to an acoustical signal so that the transceiver operator may receive communications.

In a similar manner to prior radios, microphone 100 operates through the instantaneous deviation control 102 which is adjustable through potentiometer 104 to supply a signal which modulates voltage controlled oscillator 42 the output of which is supplied to transmitter circuitry 74. The modulated information is supplied to transmitter phase detector 106 which supplies information both to transmitter error signal detector 114 and transmitter lock detector 108. Lock detector 108 controls sweep control 112 which supplies its output to transmitter error signal 114. The output of transmitter error signal 114 is coupled to transmitter VCO 116 which also supplies a signal back to transmitter phase detector 106. The transmitter section operates to modulate the synthesizer VCO 42 through microphone 100 and IDC 102 and the resulting signal is supplied to the transmitter phase locked loop.

Transmitter PLL interface gate 110 ensures that no transmission can occur unless the frequency synthesizer is locked onto a fixed correct frequency. Thus, the phase lock loop interface circuit is disabled during the frequency selection operation of the digital frequency synthesizer but this gate is enabled when that frequency is locked.

In a normal manner, the RF gate 118 supplies the RF modulated information to power amplifier 120 and then to a filter and detector network which includes automatic level control 124. The output of the RF filter and detector circuit 122 is supplied to antenna switch 76 which, during transmit operation, would be disconnected from receiver circuitry 72 and connected directly to transmitter circuitry 74. The voice signal information would then be transmitted through antenna 75 in a normal manner.

Figure 3:
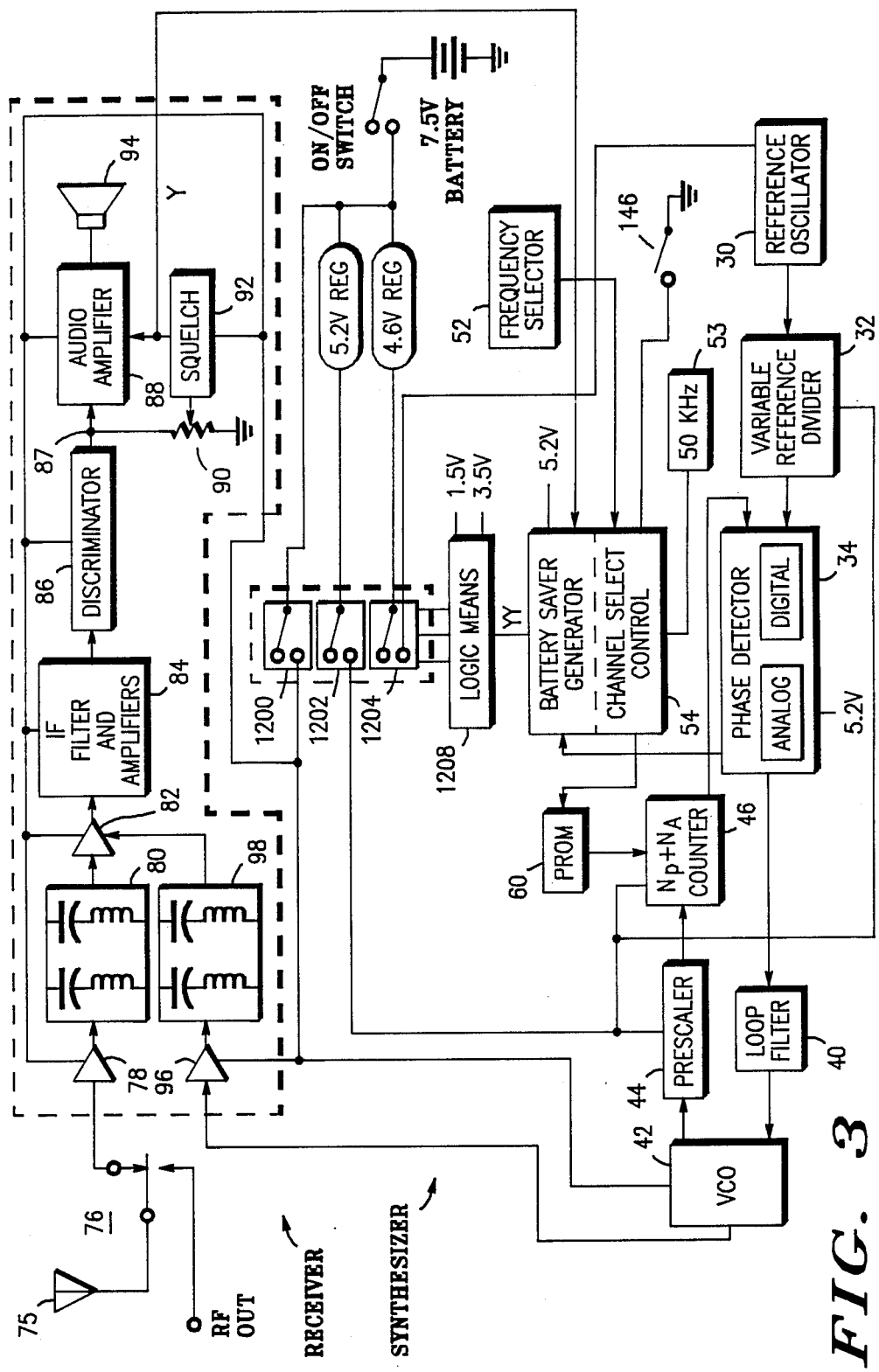
FIG. 3 is a combination electrical schematic and functional block diagram of a receiver and synthesizer employing the present battery saver invention.
Figure 4:
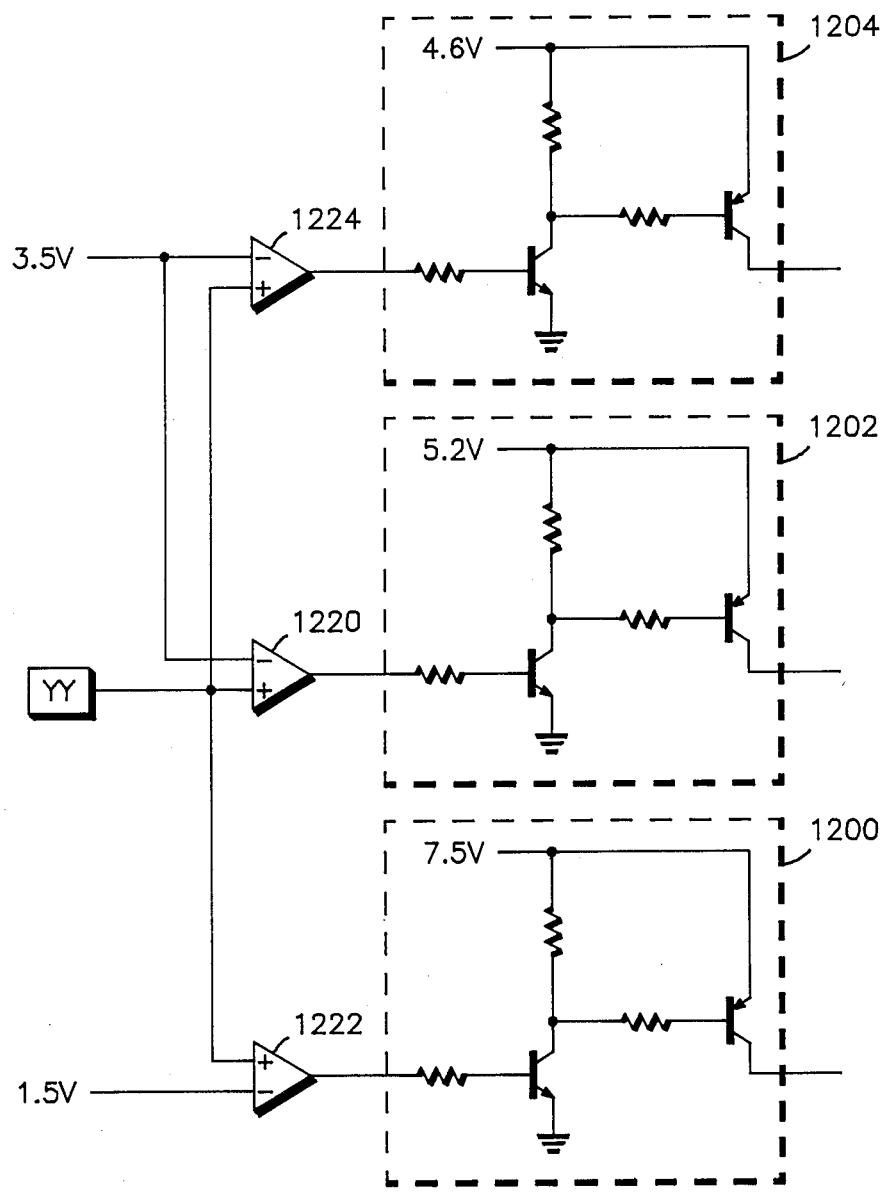
FIG. 4 is a combination logic and electrical schematic diagram of a portion of the circuit shown in FIG. 3.
Figure 5:
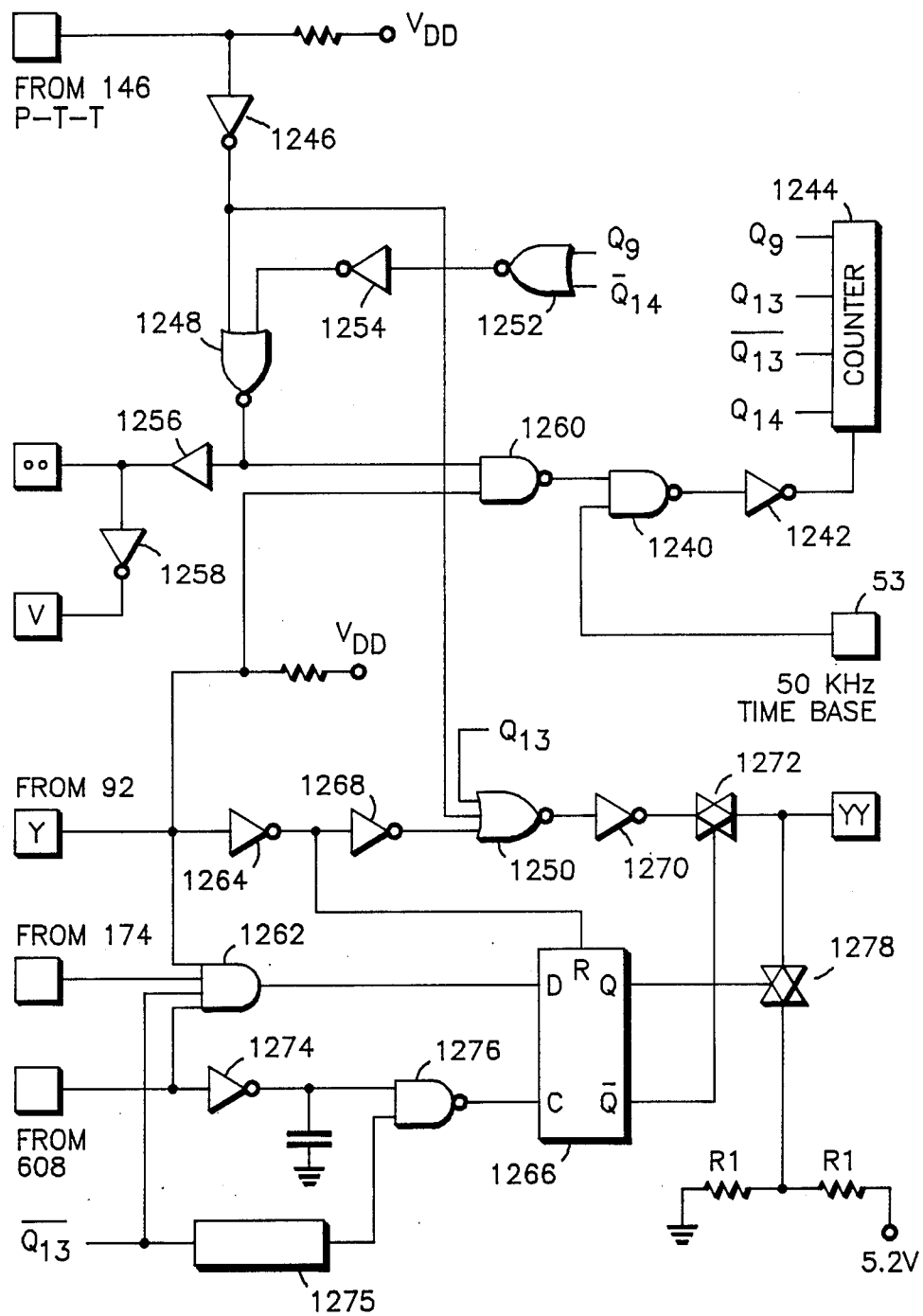
FIG. 5 is a combination logic and electrical schematic diagram of a portion of the circuit shown in FIG. 3.

FIG. 3 is a combination electrical schematic and functional block diagram of the receiver and synthesizer employing the battery saver invention. In a manner that is identical to that shown in FIG. 2, receiver portion 72 is shown with all of its component parts, as is the synthesizer with all of its appropriate blocks. In addition, the interconnections for power and battery savings are shown. The elements shown in FIGS. 3, 4 and 5 are also shown in the patent which is incorporated by reference but have been assigned new reference numbers for added clarity.

A 7.5 volt battery is supplied through a standard OFF/ON switch, to a voltage shifting circuit 1200, to a 5.2 volt regulator circuit whose output is connected to a voltage shifter circuit 1202 and to a 4.6 volt regulating circuit whose output is connected to voltage shifting circuit 1204. Voltage shifting circuits 1200, 1202 and 1204 are schematically represented as simple switches so that their operation may be more clearly understood in this figure. They will however be described in greater detail later. The output of voltage shifter 1200 is coupled in sequence to RF amplifier 78. Mixer 82, IF filter and Amplifier 84, discriminator 86, audio amplifier 88, squelch circuit 92, and multiplier 96 all shown as enclosed in receiver portion 72. In addition, the output of voltage shifter 1200 is also coupled to VCO 42.

The output of voltage shifter 1202 is coupled to NP+NA counter 46, to variable reference divider 32 and to prescaler 44. The output of voltage shifter 1204 is coupled to reference oscillator 30. The operation of the voltage shifters is controlled by logic means 1208 shown in block form but this circuit will be described in greater detail later. Logic means 1208 shows three output control lines coupled to the respective voltage shifters 1200, 1202, 1204 to cause individual actuation switch mechanisms of the voltage shifters. Logic means 1208 is also coupled to 1.5 volt and 3.5 volt voltage references. The channel select control circuit 54 in the synthesizer portion is now shown to include both the channel select control circuit and a battery saver generator. The batter saver generator is coupled to logic means 1208 via control line YY. In addition to the other components coupled to battery saver generator and channel select control 54 there is 5.2 volt source and a 50 KHz clock source designated as 53.

The interconnection of the synthesizer is identical with the interconnection shown in FIG. 2 except for the additional power and battery saving details shown here. An output of phase detector 34 is shown directly coupled to channel select control and battery saver generator 54 to indicate that a control output from the phase detector is used to establish the timing for the operation of the battery saver generator. As will be explained in greater detail for FIG. 5 this single line represents two signals from the phase detector. In all other respects, the operation of receiver portions 72 and the frequency synthesizer is as described in FIG. 1 and FIG. 2.

FIG. 3 is intended to show the power connection operation that is controlled by the battery saver generator circuit which enables the prolongation of the battery life under various conditions. As may be seen, the voltage shifter 1200 controls the supply of the 7.5 volts voltage source to the receiver section 72 and to VCO 42. Similarly, voltage shifter 1202 controls the supply of 5.2 volt to NP+NA counter 46, to variable reference divider 32 and prescaler 44. Voltage shifter 1204 controls the 4.6 volt power to reference oscillator 30. These voltage shifters are used to selectively supply power according to the appropriate battery saving operation. As may be seen in the diagram voltage sources at 4.6 or 5.2 volt are listed separately to show that these are not switched but are supplied on continuously whenever the OFF/ON switch has been activated. As for example phase detector 34 is coupled to a 5.2 volt source. This figure shows additional voltage sources rather than to tie interconnections back to the 5.2 and 4.6 volt regulators already described although in actuality the regulators are the direct source of voltage.

To further understand the operation of the circuit of FIG. 3, it is necessary to review in detail FIGS. 4 and 5. For simplicity, the logic means 1208 shown in detail in FIG. 4 may be described as follows. The YY output from battery saver generator portion of the channel select control circuit 54 is supplied to the positive input terminal of a comparator 1220. A source of reference voltage at 1.5 volt is applied to the negative terminal of a voltage comparator 1222 and a source of reference voltage at 3.5 volt is supplied to the negative input terminals of a comparator 1224 and comparator 1220. Signal YY is also applied to the positive input terminals of comparators 1222 and 1224. It will be appreciated by those skilled in the art that when the logic level on line YY is greater than 1.5 volt, the output of comparator 1222 will be high. Similarly, when the output of YY is greater than 3.5 volts the outputs of comparators 1224 and 1220 will be high. As will be described later, in the preferred embodiment a YY signal level of 2.6 volts will be used to distinguish between the 1.5 volts and 3.5 volt threshold voltages. Each of the outputs of comparators 1220, 1222 and 1224 are coupled appropriately to a circuit interconnection of resistors and transistors which are shown enclosed by a broken line and which constitute the voltage shifters schematically represented in FIG. 3. Each of the voltage shifters operates in the same manner in response to a high level signal at the output of the corresponding comparator and causes the regulated voltage to be switched at the output terminal.

The output of a comparator is applied through a first resistor to the base of an NPN transistor whose emitter is connected to ground. The appropriate source of voltage which in this case is any of 7.5, 5.2 or 4.6 volts is applied through a second resistor to a collector of the NPN transistor and to the emitter of a PNP transistor. The collector of the NPN transistor is coupled through a third resistor to the base of the PNP transistor. The switched voltage output is supplied from the collector of the second transistor upon the detection of a high level output at a corresponding comparator. Depending upon the choice of the values of the various resistors and the appropriate voltages sources, when the YY signal has an appropriate voltage to cause an output of corresponding comparator, the corresponding voltage shifter will be actuated to supply voltage at the regulator value to the appropriate interconnected sections in the receiver and synthesizer. In particular the voltage shifter outputs are such than when YY is at logic zero no power is supplied through the voltage shifters to the receiver portion 72 or synthesizer. When YY is at least 1.5 volts, the 7.5 volt voltage shifter 200 is activated and 7.5 volts is supplied appropriately to the interconnected portions of the circuit. When the signal on YY is at least 3.5 volts all of the three voltage shifters are activated and 7.5 volts, 4.6 volts and 5.2 are supplied to the interconnected components as shown in FIG. 3. As will be described later the value of 2.6 volts will be used to distinguish between the two conditions.

Referring now to FIG. 5 to understand the detailed operation of the battery saver generating portion of the channel selective control circuit 54, a 50 KHz time base source 53 is coupled to a first input of a NAND gate 1240 whose output is coupled through an inverter 1242 to a 16 stage binary counter 1244. Push-to-talk switch 146 is coupled in parallel through a resistor to VDD and through an inverter 1246 to the first input of a NOR 1248. The output of inverter 1246 is also coupled to the first input of a NOR 1250. The Q9 output of counter 244 and the Q14 bar output of counter 1244 are coupled as the inputs to a NOR 1252 whose output is coupled through an inverter 1254 to the second input of NOR 1248. The output of NOR 1248 is coupled through an inverter 1256 to form a signal 00 which is coupled through an inverter 1258 to form a signal V. The output of NOR 1248 is also coupled to the first input of a NAND 1260 whose output is coupled as the second input of NAND 1240.

The Y signal output from squelch control circuit 92 is coupled in parallel through a resistor to VDD and coupled as the second input of NAND 1260, the first input of an AND 1262 and through inverter 1264 to the reset input of a flip-flop 1266. The output of inverter 1264 is also coupled through an inverter 1268 to the second input of NOR 1250. The Q13 output of counter 1244 provides the third input to NOR 1250 whose output is coupled through an inverter 1270 to the input terminal of a transmission gate 1272.

An output from syntheziser lock detector 174 is coupled to the second input of AND 1262 and the Q13 bar output of counter 1244 is coupled as the third input of NAND 1262 and through monostable multivibrator 1275 to the first input of a NAND 1276. The discharge pulse controller 608 is coupled as the fourth input of AND 1262, through an inverter 1274 and in parallel through a capacitor to ground and to the second input of NAND 1276 whose output is coupled to the clock input of flip-flop 1266. The output of AND 1262 is coupled to the D input of flip-flop 1266. The Q bar output of flip-flop 1266 is coupled to the control input of transmission gate 1272 and the Q output of flip-flop 1266 is coupled to the control input of a transmission gate 1278. A source of 5.2 volts is coupled through a series arrangement of equal resistors with the last one coupled to ground; the center interconnection point between the resistors is coupled to the input terminal of transmisson gate 1278. This half voltage circuit will eventually be utilized to produce a YY signal level of 2.6 volt to disrupt power from the synthesizer modules only. The output of transmisson gate 1278 is coupled to the output of transmission gate 1272 which is the signal YY supplied in FIG. 3 to control the operation of the logic circuit in voltage shifters as has been described earlier. Thus, it may be seen that signal which indicates the condition of the phase detector is coupled to the battery saver generator circuit and through the logic means 1208 to actuate battery saving feature throughout the circuitry as shown in FIG. 3.

In operation, the 50 KHz time base provides the timing signals for the entire battery saving operation along with other timing aspects not related to the present invention. The timing signal is selectively supplied to a 16 stage binary counter whose various stages provide the necessary timing signals in conjunction with the logic sequence. The signals 00 and V are for the priority channels operation which is not part of the present invention, but is fully described in the now issued patent which has been incorporated by reference.

The Y signal from squelch circuit 92 senses activity on the presently tuned channel and has a low level for no activity and a high level for activity. Since battery saving does not occur during transmission, the following discussion assumes that the P-T-T switch is not activated. If there is no activity on the channel, signal YY has the same waveform and logic voltage value as Q13 from binary counter 1244. It may also be seen that activation of the P-T-T at any time will disable YY through NOR 1250.

When there is activity on the tuned channel the Y signal output is high thus enabling the AND gate 1262 when the appropriate signals from synthesizer lock detector 174, Q13 and discharge pulse controller 608 are at logic high level. Discharge pulse controller 608 will provide a periodic pulse following the last update of the sample and hold phase detector capacitor. This pulse will set the output of AND 1262 high and after a small delay through inverter 1274 and NAND 1276 it will set the Q of flip flop 1266 high thus producing the half logic supply level (2.6) at pad YY. This half logic supply level will be available for the same time duration as the high logic level of Q13.

Thus this logic sequence insures that power is removed from the synthesizer modules only at the appropriate time after the phase detector has updated its last value to the sample and hold capacitor. In this way, a frequency shift due to a switching transient is avoided. After Q13 bar drops low, the state on Pad YY will shift to its high logic state after monostable multivibrator 1275 senses the trailing edge of Q13 bar. The latter generates a small pulse which serves to reset the state of flip-flop 1266 and returning to the high logic level on pad YY.

Figure 6:
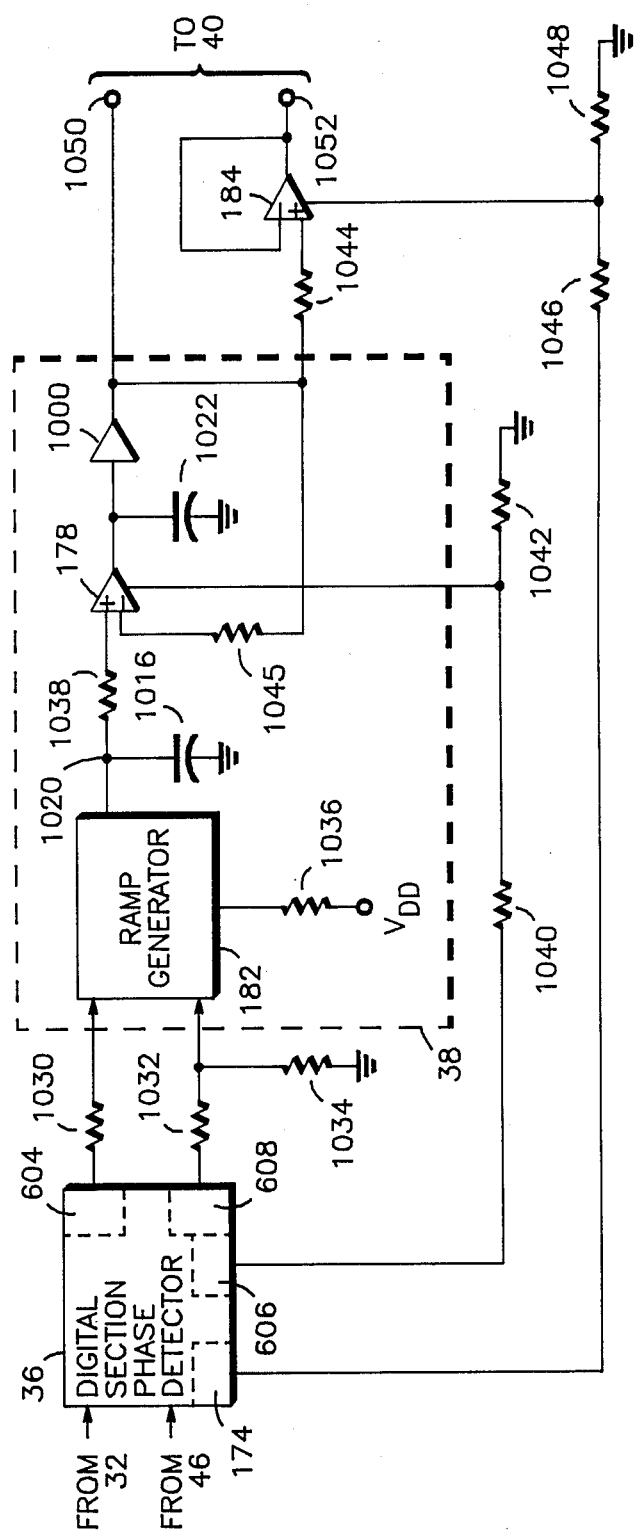
FIG. 6 is a combined electrical schematic and functional block diagram of the digital and analog sample and hold circuit of the frequency synthesizer.

FIG. 6 shows a combined block diagram and electrical schematic for the digital and analog sample and hold phase detector 34 for the frequency synthesizer. An input signal from the ouput of variable reference 32 is applied to the input of the digital section 36 of the sample and hold phase detector. An input from single synchronous binary counter 46 is applied as a second input to the digital section 36 of the sample and hold phase detector. An output from the decode logic circuit 604 is applied through a resistor 1030 to one input of ramp generator 182. An output from discharge pulse controller 608 is coupled through a resistor 1032 to a second input of ramp generator 182 which is coupled through a resistor 1034 to ground. $V_{DD}$ is supplied through a resistor 1036 to a third input of ramp generator 182.

The output of ramp generator 182 is coupled through a capacitor 1016 to ground and through a resistor 1038 to the non-inverting input of OTA 178. An output from variable pulse width generator 606 is coupled through a resistor 1040 to a control input of OTA 178 which is coupled through a resistor 1042 to ground. The output of OTA 178 is coupled through a capacitor 1022 to ground. Capacitor 1016 is the ramp capacitor for ramp generator 182 while capacitor 1022 is a hold capacitor which holds the VCO on frequency. The output of OTA 178 is coupled through unity gain buffer 1000 to provide an output to loop filter 40. The output of unity gain buffer 1000 is also coupled through resistor 1044 to the non-inverting input of acquisition OTA 184. The output of acquisition OTA 184 is supplied to loop filter 40 and is also interconnected to its inverting input terminal. An output from the synthesizer lock detector 174 is coupled through a resistor 1046 to a control input of acquisition OTA 184 and through a resistor 1048 to ground. The output of unity gain buffer 1000 is also connected through a resistor 1045 to the inverting input of OTA 178.

It will be recalled that the digital section 36 of the sample and hold phase detector 34 compares the digital pulses from the divided down reference frequency with the appropriate signal from single synchronous binary counter 46 which monitors the output of voltage controlled oscillator 42. The digital section of the phase detector as described earlier has two modes of operation. In the first mode it seeks to correct a frequency difference between the reference frequency and counted VCO frequency. When these frequencies are equivalent, the digital section operates in a phase mode for its secondary mode of operation. The choice of this type of digital and analog phase detector was based on its ability to offer maximum reference signal attenuation along with precise tuning for the digital frequency synthesis system.

Figure 7:
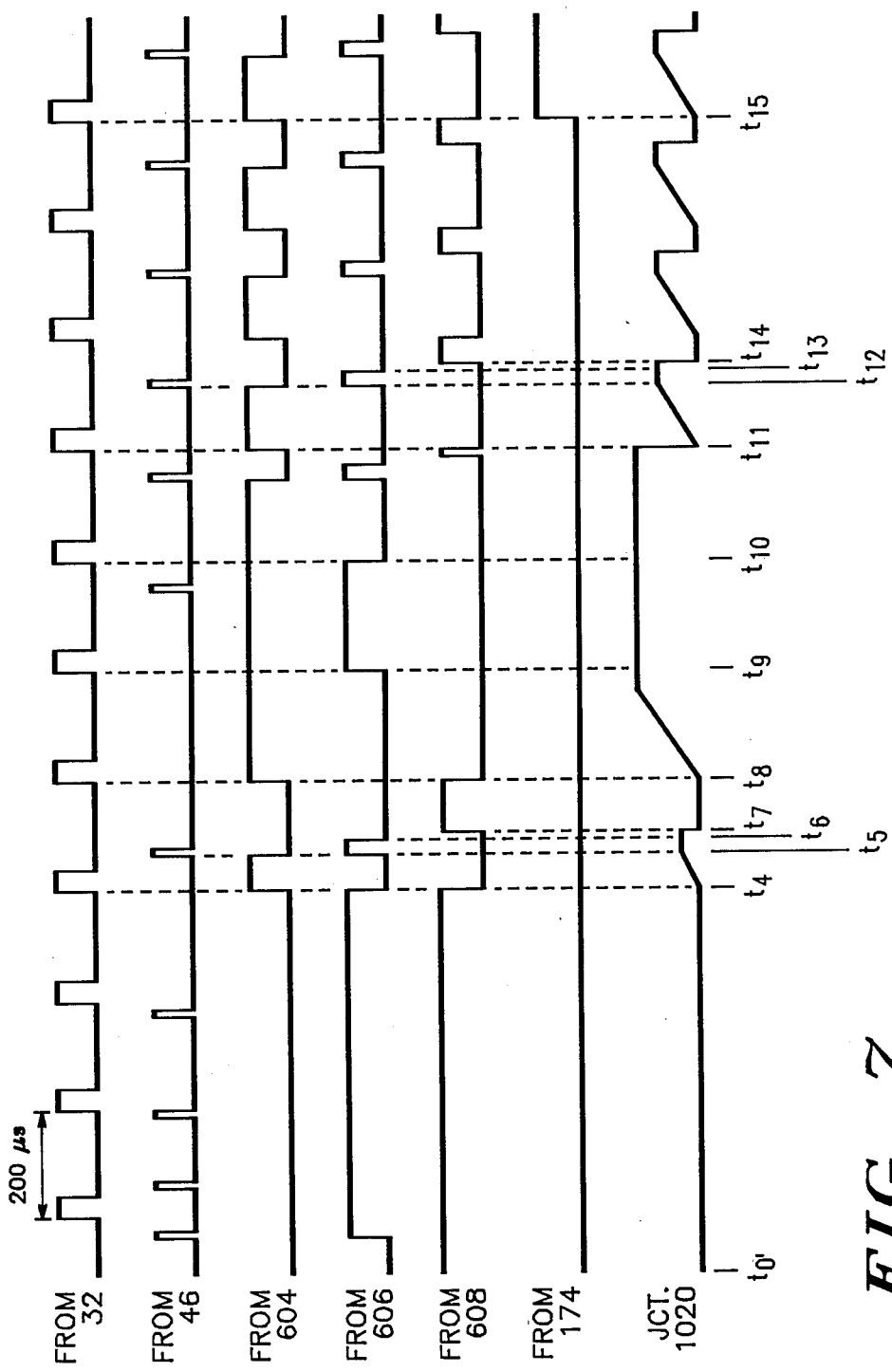
FIG. 7 is a timing diagram of the signal waveforms for the various portions of the circuit of FIG. 6.

The operation of the digital and analog sections of sample and hold phase detector 34 may best be understood by referring to FIG. 7 which shows the waveforms for the digital and analog sections of the detector. In particular, the first wave form in FIG. 7, shows the output from the variable reference divider 32 which is supplied to sample and hold phase detector 34. The second waveform shows the output of single synchronous binary counter 46. The third wavefrom shows the output of decode logic 604 and the fourth waveform shows the output of the variable pulse generator 606.

The fifth waveform shows the output of discharge pulse controller 608, and the sixth waveform shows the output from the synthesizer lock detector which is applied to transmitter PLL interface 110. The seventh waveform shows the voltage as a function of time at junction 1020 which is at the output terminal of ramp generator 182 coupling to ramp capacitor 1016.

FIG. 7 shows with clarity the different modes of operation of sample and hold phase detector. Time $t_0'$ is an arbitrary time where the VCO frequency momentarily increased after a normal phase mode period. This condition is chosen to demonstrate the full capability of the sample and hold phase detector. It may be observed that the waveform from divider 32 shows a repetitive pulse pattern throughout FIG. 7. In addition, between time $t_0'$ and time $t_4$ the output from single synchronous binary counter 46 shows two pulses interleaved in a reference period defined by the waveform for divider 32. These pulse train configurations are indicative of the fact that the VCO frequency as determined through counter 46 is much higher than the reference frequency from divider 32. It may also be observed at a time somewhat after $t_0'$ that the leading edge of the output from variable pulse width generator 606 is shown to occur at the same time as the leading edge of the pulse from counter 46. The pulse output from variable pulse width generator 606 is now supplied to OTA 178 through resistor 1040 to transfer the ramp voltage to the loop filter and thus to steer the VCO to reduce the frequency.

It should be observed that during the time interval $t_0'-t_4$ junction 1020 has a low logic level signal which functions to reduce the control voltage supply to the VCO hence its frequency. The effect of this low logic level at junction 1020 may be observed in the waveform for the pulses from counter 46. It will be observed that the distances between the first five pulses for counter 46 as shown in FIG. 7 are increasing in time which is indicative of the fact that the frequency of the VCO is being reduced.

It may also be observed that during the time period immediately prior and including $t_4$ two reference pulses from divider 32 were received by the phase detector without a corresponding pulse being detected from counter 46. Therefore, at time $t_4$, at the leading edge of the second reference pulse from divider 32 without a corresponding pulse from counter 46, decode logic 604 geneates a high logic level pulse which begins charging the ramp capacitor 1016. The effect may be observed as a ramp increase in voltage at junction 1020 as shown in the seventh waveform in FIG. 7. At time $t_5$ the first pulse from the VCO through counter 46 is detected thus terminating the signal from decode logic 604 and establishing the first sample pulse from variable width pulse generator 606. Also, at time $t_5$, the voltage at junction 1020 may be observed to being a constant voltage level which is indicative of maintaining capacitor 1016 without additional charge.

At time $t_6$, the sample pulse from variable pulse width generator 606 terminates and this is shown to correspond to an intermediate level of the constant voltage on the ramp capacitor as shown for the waveform for junction 1020. At time $t_7$, the discharge pulse controller 608 produces a high logic level signal which corresponds to discharge of ramp capacitor 1016. This is observed as a pulse termination of the voltage at junction 1020 on its corresponding waveform. The time interval between $t_6$ and $t_7$ is a digital delay built into the digital phase detector by discharge pulse controller 608 which is dependent ultimately upon the reference frequency. The purpose of this delay is to minimize the amount of reference frequency feedthrough which can reach the loop filter.

At time $t_8$, which is determined by the leading edge of the reference frequency pulse received from divider 32, we begin looking for the corresponding pulse from the VCO operating through single synchronous binary counter 46. The arrival of the leading edge of the reference pulse from divider 32 coincides with the production of the ramp enable signal from decode logic 604 and the termination of the output of discharge pulse controller 608. At this time, due to the ramp enable signal, as may be seen from the voltage waveform for junction 1020, the voltage is increased until it encounters a divided VCO frequency pulse. If no VCO frequency pulse from counter 46 is detected during this time interval, the ramp is increased to a maximum level and remains on until the next timing event. At time $t_9$, the leading edge of the next reference frequency pulse of divider 32 establishes the leading edge of a sample pulse from variable pulse width generator 606 which transfers to the VCO the voltage waveform for junction 1020 at its maximum level.

It should be observed that during the time interval $t_0'-t_8$, the VCO frequency was greatly reduced so that it could more properly corespond to the reference frequency from divider 32. Between timing intervals $t_9$ and $t_{10}$ the first pulse from counter 46, which is indicative of the VCO frequency, is detected between occurrences of a reference frequency pulse. It is during this period that the ramp generator will apply a suitable correcting voltage to the VCO through the OTAs which operate through the loop filter 40 to bring the frequency of the voltage controlled oscillator into correspondence with that of the reference frequency signal from divider 32. The interval $t_0-t_{10}$ corresponds to the frequency mode.

At time $t_{10}$, which is determined by the leading edge of a pulse from variable reference divider 32, the sample pulse from variable pulse width generator 606 is terminated, and it may be seen from the voltage waveform for junction 1020 that this corresponds to a continuance of the signal applied to ramp capacitor 1016.

During the interval time $t_{10}-t_{11}$, the detection of the pulse from the voltage controlled oscillator operating through counter 46 triggers the termination of the pulse from decode logic 604 and the initiation of a sample pulse from variable pulse width generator 606. The purpose of this is to sample the voltage as shown by the waveform for junction 1020 to begin the process of bringing the VCO frequency into phase with the reference frequency from divider 32. It may also be observed that the waveform from discharge pulse controller 608 shows a relatively short period pulse to cause discharging of the ramp capacitor 1016.

After time $t_{11}$ since the VCO pulse as detected through counter 46 is now interleaved between two reference pulses from divider 32 the sample and hold phase detector now enters its phase mode of operation. The waveforms during the interval just previous to $t_{10}$ and after $t_{11}$ are indicative of the fac that the frequency of the VCO starts approaching the frequency of the reference frequency from divider 32.

During the interval $t_{11}-t_{12}$, observing the waveform from decode logic 604, the pulse shown is proportional to the phase difference between the reference signal from divider 32 and the detected VCO pulse from counter 46. This may be seen in the waveform for junction 1020 as the period during which a ramp up signal is applied to ramp capacitor 1016. The DC level on the signal for junction 1020 at time $t_{12}$ will be proportional to the phase difference between the two input signals.

During the time interval $t_{12}-t_{13}$, the DC level which exists at junction 1020 is sampled by means of the pulse produced by variable pulse width generator 606. The DC level is transferred to the operational transconductance amplifier and supplied to loop filter 40 for application to the voltage controlled oscillator. The time period between $t_{13}$ and $t_{14}$ is, again, a repeat of the time delay to minimize the feedthrough of the reference frequency into the loop filter 40. This time delay is similar to the time delay which is built into the system and as shown earlier between $t_6$ and $t_7$.

At $t_{14}$, the discharge pulse controller 608 waveform leading edge corresponds to the discharge of the voltage at junction 1020 which is indicative of discharging the ramp capacitor 1016. During this time and to the end of the diagram the sample and hold phase detector is in regular phase mode operation.

The phase detector continues to monitor in a phase mode any phase difference between the reference signal and the VCO signal. During this interval, the ramp is applied up to a voltage level which corresponds to the detected phase difference. By this means, the sample and hold phase detector can steer the VCO to maintain the correct phase relationship between the input signals. Thus, the phase detector is operating in a manner that is similar to prior art phase detectors in that the phase between two signals is detected and the voltage controlled oscillator is adjusted so as to maintain the relationship in phase.

At time $t_{15}$, it should be observed that the waveform for the synthesizer lock detector 174 goes to a high level indicating that both the frequency and phase have been detected and locked. This takes more than one sample of detection of the phase mode due to the time delay built into the operation of the spike filter circuit connected to synthesizer lock detector 174.

Considering now the overall operation of the digital and analog portions of phase detector 34 it will be seen that the digital portion operates in one of two possible modes to first determine the difference in frequency between the reference signal and the VCO signal and when the frequencies are brought into equality to switch to a phase operation so that the VCO may be controlled to any detected phase difference.

Figure 8:
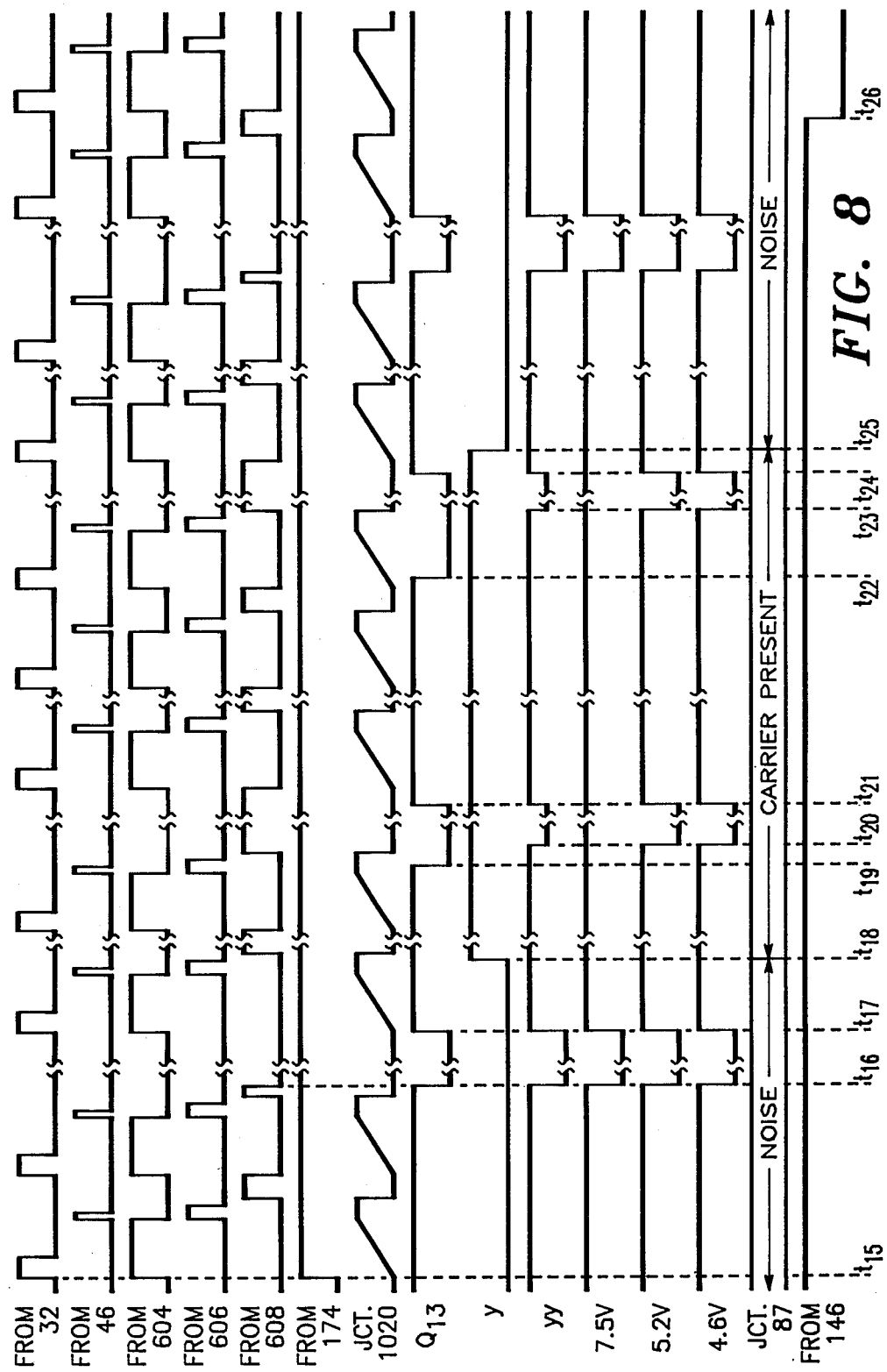
FIG. 8 is a timing diagram of the signal waveforms for the various portions of the synthesized transceiver containing the battery saving invention.

FIG. 8 shows a timing diagram of the waveforms for identified elements in the receiver and synthesizer. It is similar to FIG. 7 but presents a more comprehensive description of the timing relationships for the battery saver system for the synthesizer.

$T_{15}$ is the phase and frequency locked condition for the phase detector previously described in FIG. 7. This is used as a starting time for a more comprehensive description. At time $t_{16}$ the logic state of Q13 goes low and since the level of signal Y is low (no activity on the channel), the logic level on Pad YY drops to 0 volts. During this condition and until $t_{17}$ all power is removed from the synthesizer and receiver modules of the transceiver. At $t_{17}$ when Q13 returns to its high logic level, power is restored to all modules. The OFF time ($t_{16}-t_{17}$) is proportional to the time base 53 and counter 1244, the timing for the preferred embodiment is approximately 164 msec.

At $t_{18}$ the presence of a carrier signal is detected by squelch circuit 92 hence, logic signal Y switches to a high level. At $t_{19}$ the logic state of Q13 drops low again. But the waveform at Pad YY does not follow it until the pulse from the discharge pulse control 608 occurs. At $t_{20}$ after the hold capacitor has been updated in the phase detector, the waveform at pad YY drops to half supply or 2.6 volts. As has been described, the logic circuit detects signals greater than 1.5 volts and less than 3.5 volts. This effectively switches of the synthesizer modules by voltage shifters 1202 and 1204 while not disrupting the output frequency of the VCO module. At $t_{21}$, the logic level of Q13 changes to the high state, and power is restored to the synthesizer modules through voltage shifters 1202 and 1204.

During the time interval $t_{22}$–$t_{23}$ another battery savings cycle begins and is characterized by the Q13 level going low but no disruption of power occurs until $t_{23}$ where the pulse from the discharge pulse controller occurs. At $t_{24}$ power is restored to the synthesizer circuits. At $t_{25}$ the RF carrier disappears and this condition is detected when the signal on pad Y drops low. At this time the receiver and synthesizer battery saving is produced as described in FIG. 8 for the $t_{16}$–$t_{17}$ time interval. At $t_{26}$, the PTT has been depressed and all battery saver sequence is disabled.

While a specific embodiment of this invention has been shown and described, further modifications and improvements will occur to those skilled in the art. All modifications which retain the basic underlying principles and claim herein are within the scope of this invention.

What is claimed is:

1. In a digital frequency synthesizer having a reference frequency source, sample and hold phase detector, voltage controlled oscillator and variable frequency divider, a power saving system comprising:
   a power source; and
   a power saving generator means generating a power saving signal having a predetermined duty cycle and period, said generator means, being coupled between said synthesizer and said power source, and responsive to the hold timing periods of said phase detector to interrupt power to said reference frequency source and variable divider in synchronism with the establishment of the hold timing periods of the phase detector to conserve power yet maintain the voltage controlled oscillator output without deviation or interruption.

2. The power saving system of claim 1, wherein said reference frequency source further comprises a reference oscillator coupled to a reference frequency divider.

3. The power saving system of claim 1, wherein said variable frequency divider includes a prescaler and a programmable divider.

4. The power saving system of claim 3, wherein the prescaler is a dual modulus prescaler.

5. In a digital frequency synthesized portable receiver of the type having a receiver portion and a synthesizer for tuning the receiver including a reference frequency source, a sample and hold phase detector, a voltage controlled oscillator, and a variable frequency divider, a power saving system for selectively supplying power to the receiver and synthesizer, comprising:
   a power source; and
   a power saving generator means, coupled between said power source and said synthesizer and receiver portion, and responsive to the hold timing periods of the phase detector to interrupt power to the reference frequency source, and variable frequency divider in synchronism with the establishment of the hold timing periods of the phase detector to conserve power yet maintain the voltage controlled oscillator tuning output without deviation or interruption.

6. The power saving system of claim 5, wherein said reference frequency source further comprises a reference oscillator coupled to a reference frequency divider.

7. The power saving system of claim 5, wherein said variable frequency divider includes a prescaler and a programmable divider.

8. The power saving system of claim 7, wherein the prescaler is a dual modulus prescaler.

9. The power saving system of claim 5, wherein said receiver portion further includes means for monitoring the presence or absence of carrier signal and said power saving generator means further includes means for interrupting power to the receiver portion and voltage controlled oscillator in the absence of the detection of a carrier signal.

10. In a digital frequency synthesized portable transceiver of the type having transmitter and receiver portions and a synthesizer for tuning the transceiver including a reference frequency source, a sample and hold phase detector, a voltage controlled oscillator, and a variable frequency divider, a power saving system for selectively supplying power to the receiver and synthesizer, comprising:
    a power source; and
    a power saving generator means, coupled between said power source and receiver portion and said synthesizer, and responsive to the hold timing periods of the phase detector to interrupt power to the reference source and variable frequency divider in synchronism with the establishment of the hold timing periods of the phase detector to conserve power yet maintain the voltage controlled oscillator tuning output without deviation or interruption.

11. The power saving system of claim 10, wherein said reference frequency source further comprises a reference oscillator coupled to a reference frequency divider.

12. The power saving system of claim 10, wherein said variable frequency divider includes a prescaler and a programmable divider.

13. The power saving system of claim 12, wherein the prescaler is a dual modulus prescaler.

14. The power saving system of claim 10, wherein said receiver portion further includes means for monitoring the presence or absence of carrier signal and said power saving generator means further includes means for interrupting power to the receiver portion and voltage controlled oscillator in the absence of the detection of a carrier signal.

15. The power saving system of claim 14, wherein said transmitter portion includes means for the detection of a transmit demand and said power saving generation means responds to this detection by interrupting all power saving operations.

* * * * *